United States Patent [19]

Dennard et al.

[11] 4,182,636
[45] Jan. 8, 1980

[54] METHOD OF FABRICATING SELF-ALIGNED CONTACT VIAS

[75] Inventors: Robert H. Dennard, Croton-on-Hudson; Vincent L. Rideout, Mohegan Lake, both of N.Y.

[73] Assignee: International Business Machines Corporation, Armonk, N.Y.

[21] Appl. No.: 920,913

[22] Filed: Jun. 30, 1978

[51] Int. Cl.$^2$ ............................................. H01L 21/22
[52] U.S. Cl. ..................................... 148/187; 29/571; 148/1.5
[58] Field of Search ..................... 148/187, 15; 29/571

[56] References Cited

U.S. PATENT DOCUMENTS

| | | | |
|---|---|---|---|
| 3,751,722 | 4/1971 | Richman | 148/187 X |
| 3,752,711 | 8/1973 | Kooi et al. | 148/33.3 |
| 3,834,959 | 9/1974 | Dennard et al. | 156/11 |
| 3,869,322 | 3/1975 | Cuomo et al. | 148/188 |
| 3,899,363 | 8/1975 | Dennard et al. | 148/187 X |
| 4,023,195 | 5/1977 | Richman | 148/1.5 X |

OTHER PUBLICATIONS

IEEE Trans. Electron Dev., Ed-20, (1973), p. 840.

*Primary Examiner*—G. Ozaki
*Attorney, Agent, or Firm*—Thomas J. Kilgannon, Jr.

[57] ABSTRACT

A fabrication method is disclosed for providing self-aligned (i.e., misregistration tolerant or "borderless") contact vias for electrical connections between metal interconnection lines and underlying doping semiconductive regions of an integrated circuit. The described method utilizes an oxidation barrier layer material which is patterned twice to provide, first, the recessed oxide isolation regions and, later, the self-aligned contact vias. An example of an n-channel FET embodiment is described wherein self-aligned contact vias are provided between aluminum interconnection lines and n-type doped source and drain regions. In the described method, at least a portion of the normally present misregistration region or border is eliminated between the boundary of a recessed isolation oxide and the boundary of the via. The latter is ultimately coincident with the boundary of an underlying doped region. Elimination of contact borders advantageously reduces the overall area required for the contact, and consequently, reduces the overall surface area of the integrated circuit chip. Additionally, the metal step coverage at the contact edges is improved over prior art etched contact vias. The self-aligned contact via is achieved by repeated patterning of an oxidation barrier coupled with the intermediate step of thermally growing a thick insulation oxide layer over areas wherein devices such as FET's or bipolar transistors will be formed.

16 Claims, 24 Drawing Figures

METHOD OF FABRICATING SELF-ALIGNED CONTACT VIAS

DESCRIPTION

Technical Field

The present invention relates generally to a method for fabricating semiconductor integrated circuits and more particularly, to a method for fabricating self-aligned (i.e. misregistration tolerant or borderless) contact vias for providing electrical connections between metal interconnection lines and doped regions in the semiconductor substrate of an integrated circuit. Still more particularly, it relates to a method for fabricating self-aligned contact vias for providing electrical connection between aluminum interconnection lines and n-type doped source and drain regions of an n-channel field effect transistor (FET), and between aluminum lines and p-type substrate regions of an n-channel FET.

BACKGROUND ART

It is known in the prior art that integrated circuits containing tens of thousands of transistors on a single semiconductive substrate or chip may be fabricated and that such transistors must be electrically interconnected to form desired circuits. A semiconductor chip typically measures about one-quarter of an inch on a side, or less. For any desired integrated circuit function, the chip area is determined primarily by the area devoted to the isolation between devices; the devices (transistors, capacitors, resistors), the interconnection lines (diffused silicon, polysilicon, aluminum), and the intraconnection contacts or vias that electrically connect one conductive line type to another. One of the elements of a conventional integrated circuit which has large area requirements is the metal-to-diffused silicon or metal-to-implanted silicon contact.

Methods for providing intraconnection contact holes or "vias" are known in the art. FIG. 1 illustrates a conventional contact via formed by chemical or plasma etching through a thermally grown or chemically vapor deposited (CVD) oxide. Although the situation of perfect mask-to-mask alignment is illustrated, a misalignment region or border 1 must be provided between the boundary 2 of the contact via and the boundary 3 of the recessed isolation oxide. FIG. 2 shows the etched contact via method of FIG. 1, but in the case of a significant mask-to-mask misregistration. In forming the contact via by etching, over-etching is required to insure that all of the oxide is removed from all of the contact vias on the chip. If, due to mask-to-mask misregistration, the contact via is partially located over the recessed isolation oxide, some of the recessed oxide will be removed during the over-etching step as shown in FIG. 2. The metal interconnection material, aluminum, for example, may then electrically short to the p-type substrate rendering the circuit inoperable. The shorting problem just described is accentuated when very shallow (less than 0.5 micron) n-type source and drain regions are used in very large scale integrated (VLSI) FET circuits. One prior art approach for eliminating the above described shorting problem is shown in FIG. 3. FIG. 3 is a cross-sectional drawing of an etched, non self-aligned via connection in which the contact area has been rediffused with a fast diffusing species such as phosphorus. In FIG. 3, a contact hole is opened by conventional etching through an oxide layer over a shallow arsenic doped n-type region 4. Then, a thin layer of phosphorus-rich glass is deposited over the entire substrate, and phosphorus is diffused into the contact hole. Phosphorus diffuses much faster than arsenic and thus a deeper n-type diffused region 5 is formed in the vicinity of the contact hole. Now, an additional masking step is used to reopen the contact holes through the thin phosphorus doped glass layer and a metal contact is formed as shown in FIG. 3. Thus, the electrical shorting problem shown in FIG. 2 is eliminated but at the expense of an additional deposition step and an additional masking operation.

Other difficulties associated with etched contact vias to diffused regions involve the contact resistance, pinhole reliability, and metal step coverage.

FIG. 4 illustrates a difficulty that occurs if one attempts to locate a minimum allowable size contact hole (typically about 2.5 microns in diameter) on a minimum width diffused line (typically about 2.5 microns wide). The contact resistance is inversely proportional to the area of contact to the n-type region. If, for example, the mask-to-mask misregistration is about 1.25 microns as shown in FIG. 4, the contact resistance will be about double that of the perfectly registered case. Such fluctuations in contact resistance are generally intolerable, and in order to prevent them, the doped n-type region typically is expanded in the vicinity of a contact via, as shown in FIG. 1, to eliminate or at least minimize contact resistance variations. Another difficulty is associated with etching contact vias through thick oxide layers. During etching of the intended contact via, any defect in the masking pattern or in the resist layer will provide a site for etching an unwanted via, or pinhole. Wherever a metal interconnection line crosses a pinhole, an unwanted electrical short circuit to a device region or to the substrate may occur. In order to reduce the detrimental occurrence of contact via pinholes, double masking and/or double etching operations can be utilized, but with a resultant increase in fabrication complexity and cost.

Yet another difficulty associated with etched contact vias is the metal step coverage or thinning at the boundary of the via as shown at 6 in FIG. 4. This problem has been described, for example, by R. A. Moline, R. R. Buckley, S. E. Hoszko, and A. U. MacRae, "Tapered Windows in SiO$_2$ by Ion Implantation", IEEE Trans. Electron Dev., ED-20, p. 840, Sept. (1973). These authors describe the use of ion implantation to locally alter the etching rate of the insulating oxide layer, thereby reducing the severity of the step.

Apart from the above-described considerations, some of the individual steps or combinations of steps utilized in the practice of the present invention are known. For example, the formation of selective, local or semi-recessed oxide isolation regions is described in U.S. Pat. No. 3,751,722, filed Apr. 30, 1971, and U.S. Pat. No. 3,752,711, filed June 1, 1971. A method for forming fully-recessed oxide isolation regions is described in U.S. Pat. No. 3,899,363, filed June 28, 1976 and assigned to the same assignee as the present invention. These patents utilized a delineated oxidation barrier layer such as silicon nitride, aluminum nitride, boron nitride, aluminum oxide, or silicon carbide to permit recessed oxide isolation regions to be thermally grown everywhere in the surface of a silicon substrate except where surface is masked by portions of the delineated oxidation barrier layer. After thermal growth of the recessed isolation oxide, all the methods of the above-mentioned patents utilized a step which completely removes the remaining portions of the oxidation barrier layer by dissolving them in a suitable etchant. In contrast to this, the method of the present application patterns by masking, and removes by etching, only a portion of the remaining oxidation barrier layer so that self-aligned contact areas can be formed.

In the prior art, the region where the oxidation barrier is removed is subjected to an etch and subsequent growth of a recessed isolation oxide. In yet another prior art approach, in U.S. Pat. No. 3,834,959, filed June 30, 1972 and assigned to the same assignee as the present invention, an oxidation barrier such as silicon nitride is deposited and delineated in certain places and subsequently remains in place as an oxidation barrier during later processing. It is never subsequently removed nor is any portion of it removed and it appears as a gate dielectric in the resulting structure. In contrast, in the present method, the nitride is patterned twice; first, to define the recessed oxide isolation regions and what remains is etched a second time to reduce the size of the oxidation barrier to contact size proportions. An insulation oxide regrowth step now forms a thick insulation oxide which extends to the new boundary of the oxidation barrier layer such that the latter is surrounded by recessed oxide and thick insulation oxide. Removal by dissolving of the remaining portion of the oxidation barrier layer now provides a contact via self-aligned to an underlying doped region which was formed by ion implantation or diffusion prior to the insulation oxide regrowth.

Accordingly, it is an object of the present invention to provide an improved method for fabricating intraconnection contact vias between metal interconnection lines and doped regions of a semiconductive substrate for electrically interconnecting transistors and other devices of an integrated circuit.

A further object of the invention is to provide a method for fabricating contact vias in which at least a portion of the boundary of the via is self-aligned to the boundary of the recessed isolation oxide and/or to the boundary of the underlying doped semiconductor region, and, wherein the underlying doped areas are greater in area than the desired contact areas.

Another object of the invention is to provide a method for fabricating a contact via of minimum size on a doped line of minimum width without significant fluctuations in contact area or in contact resistance.

Still another object of the invention is to avoid etching contact vias through a thick oxide layer thereby avoiding potential pinhole reliability problems.

Still another object of the present invention is to provide metal to doped region contact vias with improved metal coverage of the oxide step at the boundary of the contact via.

BRIEF SUMMARY OF THE INVENTION

The integrated circuit fabrication method of the present invention, in a preferred embodiment, utilizes a delineated oxidation barrier layer such as silicon nitride formed on the surface of a silicon substrate as a mask around which a recessed oxide is formed by thermal oxidation. The remaining nitride defines the outer boundaries of an underlying doped region to be formed in the silicon substrate by ion implantation or diffusion. The doped region is of greater area than the area of the subsequently formed contact via. To define a contact via in a predetermined location, desired portions of the remaining nitride are then removed exposing portions of the semiconductor substrate surface. What remains is a region of nitride that has the dimensions of the desired contact via. Regions of the semiconductor substrate not covered by recessed isolation oxide are doped by ion implantation. A thermal oxidation of the exposed surface of the silicon substrate is carried out to form a thick insulation oxide except where masked by the remaining nitride. The boundary or boundaries of the insulation oxide now extend to the boundary or boundaries of the oxidation barrier layer. At this juncture, the oxidation barrier portions are removed by dissolving in a solvent exposing a contact area to which metallization can be applied. As a result of the process, all contact vias are self-aligned to the boundaries of the recessed oxide and to the boundaries of the n-type doped regions defined by the boundaries of the recessed isolation oxide. Metal lines are then formed over the self-aligned vias. The approach utilized can be applied to the fabrication of FET or bipolar transistors in integrated circuit form. The transistor devices may be formed by known ion implantation techniques in areas other than the contact areas.

These and other objects, features and advantages will become more apparent from the following particular description of the preferred embodiments.

DETAILED DESCRIPTION OF THE PREFERRED EMBODIMENTS

For convenience, the discussion of the fabrication steps is directed to the preferred aspect to employing a p-type silicon substrate as the semiconductive substrate and an n-type impurities as the diffused or implanted dopant impurities. This leads to the n-channel FET technology. Accordingly, it is understood that an n-type substrate and p-type diffused or implanted dopant impurities can be employed according to the present invention in the p-channel FET technology.

It is understood that when the diffusion refers to n-type impurities, the process steps are applicable to p-type impurities and vice versa. Also, the present invention is applicable to substrates other than silicon which are known in the art. Also, as used herein, the terms "metallic type interconnection lines" or "high-conductivity interconnection lines" refer to metal lines such as aluminum as well as to non-metallic materials (e.g., highly doped polysilicon or intermetallic silicides) which nevertheless can have conductivities of the magnitude generally possessed by conductive metals. Moreover, the terms "polysilicon" and "polycrystalline silicon" are used herein interchangeably as in the prior art. Furthermore, the terms "oxide" and "silicon dioxide" are used herein interchangeably as in the prior art. Also, when reference is made to impurities of a "first type" and ta impurities of the "second type", it is understood that the "first type" refers to n or p-type impurities and "second type" refers to the opposite conductivity type. That is, if the "first type" is p, then the "second type" is n. If the "first type" is n; then the "second type" is p.

Figure 1:
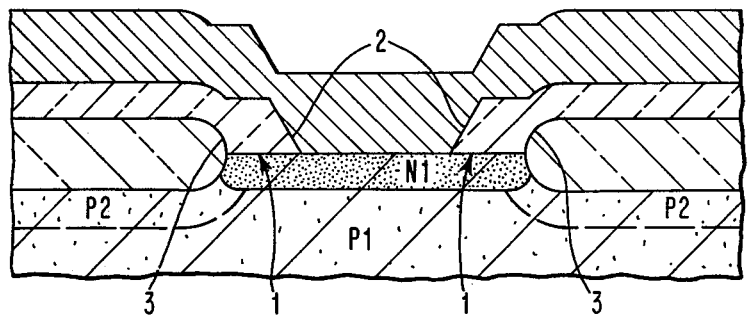
FIG. 1 shows a cross sectional view of a prior art, etched, non self-aligned, contact via connection between a metal line and a diffused silicon region through a thick intervening oxide insulation layer.
Figure 2:
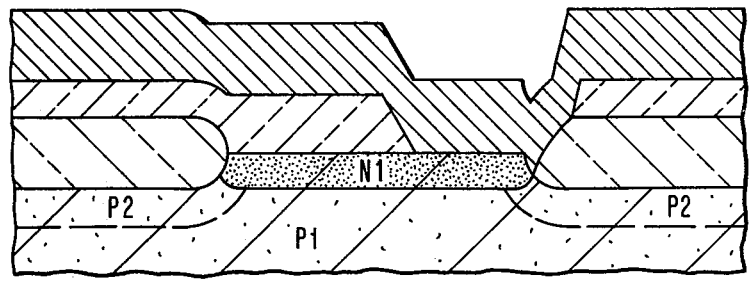
FIG. 2 shows a cross-sectional view of the prior art structure of FIG. 1 under the condition of extreme mask-to-mask misregistration.
Figure 3:
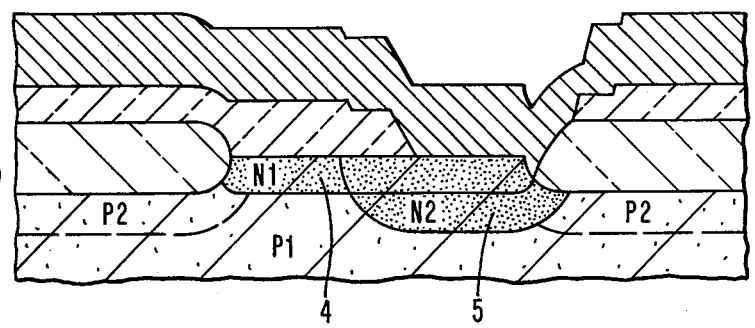
FIG. 3 shows a cross-sectional view of a prior art, etched, non self-aligned, via connection in which the contact area has been rediffused with a fast diffusing dopant species such as phosphorus.
Figure 4:
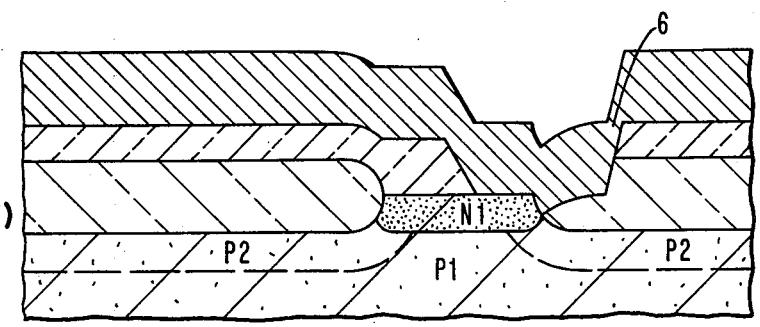
FIG. 4 shows a cross-sectional view of a prior art structure of FIG. 1 in which a conventional etched via of minimum area is misregistered with respect to a diffused line of minimum width.
Figure 5A:
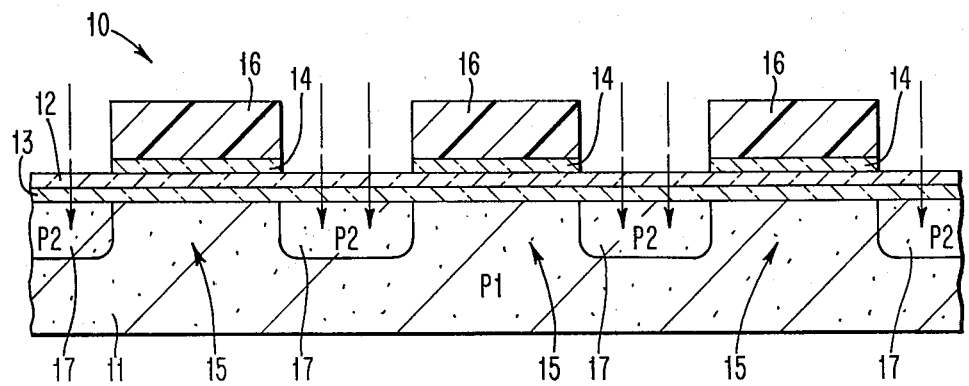
FIGS. 5A, 5B, 5C, 5E and 5F show cross-sectional views of an integrated circuit at various intermediate states in the present process which illustrate the fabrication of self-aligning contact vias between aluminum interconnection lines and n-type doped silicon regions in accordance with the teaching of the present invention.

Referring to FIG. 5A, there is shown a cross-sectional view of a portion of an integrated circuit 10 in an intermediate state after a number of processing steps, which will be described hereinafter in detail, have been carried out. Circuit 10 includes a p-type silicon substrate 11 having any desired crystallographic orientation (e.g., <100> orientation) and a doping concentration $p_1$ of typically about $1 \times 10^{15} cm^{-3}$. Substrate 11 is prepared by slicing and polishing a silicon boule grown in the presence of a p-type dopant such as boron by conventional crystal growth techniques. Other p-type dopants for silicon include gallium and indium. In the present process, the first lithographic masking operation is used to form, in a known manner, recessed isolation oxide regions, and associated p-type channel stopper regions having a doping concentration, $p_2$, of typically about $1 \times 10^{17} cm^{-3}$. The ultimately formed recessed oxide isolation regions will serve to electrically isolate adjacent device regions, while the channel stopper regions serve to prevent unwanted parasitic leakage currents from flowing between adjacent device regions and under the isolation regions.

In order to form a recessed oxide region, an adherent oxidation barrier layer such as silicon nitride, aluminum nitride, boron nitride, aluminum oxide or silicon carbide must be delineated and positioned over those regions wherein devices are to be subsequently fabricated. Preferably, the oxidation barrier is of silicon nitride and is approximately 300 to 1000 Angstroms thick, preferably 700 Angstroms thick. The oxidation barrier is shown as layer 12 in FIG. 5A. Layer 12 may be deposited by conventional chemical-vapor deposition (CVD) techniques. Additional thin silicon dioxide layers 13 and 14 may be provided above and below silicon nitride layer 12 as shown in FIG. 5A to aid in the delineation of layer 12 and to prevent damage to the underlying regions 15 of silicon substrate 11 wherein devices are to be subsequently formed. Silicon dioxide layer 13 is approximately 300 to 1000 Angstroms thick, preferably 400 Angstroms thick and is formed by CVD or, preferably, by thermal oxidation in dry oxygen at a temperature of approximately 900° to 1000° C., preferably 950° C. Silicon dioxide layer 14 is approximately 300 to 1000 Angstroms thick, preferably 500 Angstroms thick, and is formed by CVD.

In FIG. 5A, layer 14 serves as an etching mask to delineate the device pattern into layer 12, while the layer 12 serves as an oxidation barrier layer during the subsequent growth of the isolation oxide regions. If desired, layer 12 can also serve as an etching mask to delineate the device pattern into oxide layer 13. The material of oxidation barrier layer 12 should not oxidize, or at most only oxidize extremely slowly relative to the oxidation rate of silicon or polysilicon. Oxidation barrier layer 12 is considered to be a non-oxidizing material under the conditions to which it is subjected in the method of the present invention. The oxidation barrier layer 12 prevents oxidation of underlying regions 15 wherein devices are to be subsequently formed.

A device pattern determining layer such as a layer 16 of resist material of the type employed in known lithographic masking and etching techniques is placed over the surface of thin oxide layer 14. Any of the well-known photosensitive, polymerizable resist materials known in the art may be used. Resist layer 16 is approximately 10,000 Å thick. Resist material layer 16 is applied as by spinning on or by spraying, dried, and portions thereof are selectively exposed to ultraviolet radiation through a photolithographic mask in a well-known manner. This mask used in the first masking step of the present invention is of a transparent material having opaque portions in a predetermined pattern. The masked substrate 11 is subjected to ultraviolet light, polymerizing the portions of the resist material underlying the transparent regions of the mask. After removing the mask, substrate 11 is rinsed in a suitable developing solution which washes away the portions of the resist material which were under the opaque regions of the mask and thus, not exposed to the ultraviolet light. The resulting assembly may then be baked to further polymerize and harden the remaining resist material 16 which conforms to the desired pattern, i.e., it covers regions 15 in which the devices are to be subsequently formed.

Next, integrated circuit 10 is treated to remove the portions of the silicon dioxide layer 14 not protected by the remaining portions of resist layer 16. Substrate 11 is immersed in a solution of buffered hydrofluoric acid. This etching solution etches away the thus exposed portions of silicon dioxide layer 14 but does not attack the remaining portion of resist layer 16, oxidation barrier layer 12 of silicon nitride, or other materials of circuit 10.

Next, p-type channel stopper regions 17 are formed in substrate 11 by implanting boron ions of about $1 \times 10^{13} cm^{-2}$ dose and 150 KeV energy. The boron ions penetrate through layers 12 and 13, and enter silicon substrate 11 where recessed oxide isolation regions are to be subsequently formed. Boron ions do not penetrate through the combination of resist layer 16 and underying layers 12, 13, 14, and thus do not enter regions 15 wherein devices are to be subsequently formed.

FIG. 5A shows a cross-section of circuit 10 after the steps discussed above have been carried out.

Figure 5B:
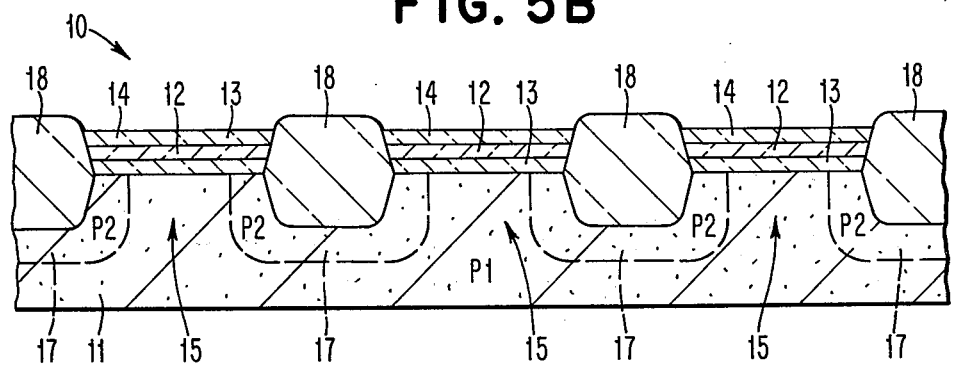

Referring now to FIG. 5B, there is shown a cross-sectional view of circuit 10 in a later intermediate state after a number of processing steps which will be described in detail in what follows, have been carried out.

The remaining portions of photoresist layer 16 above the etched oxide layer 14 in FIG. 5A are removed by dissolving in a suitable solvent. The remaining silicon dioxide portions of layer 14 conform to a predetermined pattern, and now serve as a mask for etching predetermined patterns in oxidation barrier layer 12. Layer 13, if present, serves as a pad or gasket to prevent strain damage to the underlying device regions 15 of silicon substrate 11 by nitride layer 12.

Patterns in layer 12, when silicon nitride is used, can be formed by etching in a phosphoric acid solution at 180° C. Phosphoric acid does not attack other materials of circuit 10. Then, recessed isolation oxide regions 18 are formed by thermal oxidation in the presence of dry oxygen or steam. Preferably, the isolation oxide is formed by thermal oxidation in steam at a temperature of about 900° to 1000° C., preferably 950° C., to a thickness of about 4000 to 10,000 Angstroms, preferably 6500 Angstroms.

The method steps described thus far are known in the art. In the prior art discussed hereinabove, after forming recessed oxide regions like regions 18, the next step in the prior art is to completely remove the remaining portions of oxidation barrier layer 12 by dissolving in a suitable solution, such as hot phosphoric acid where a nitride oxidation barrier layer is used. In contrast to such teachings, however, in the method of the present invention, it is essential that a portion, but not all, of the remaining portions of oxidation barrier layer 12 be retained. If all of the remaining portions of oxidation barrier layer 12 are completely removed at this stage in the process, it will not be possible to form self-aligning contact vias to a smaller area of the n-type doped regions of silicon substrate 11. To remove a portion of each of the remaining portions of layer 12, a second basic lithographic masking operation is employed to form resist regions 19 which preserve a portion, but not all, of the remaining portions of oxidation barrier layer 12.

Figure 5C:
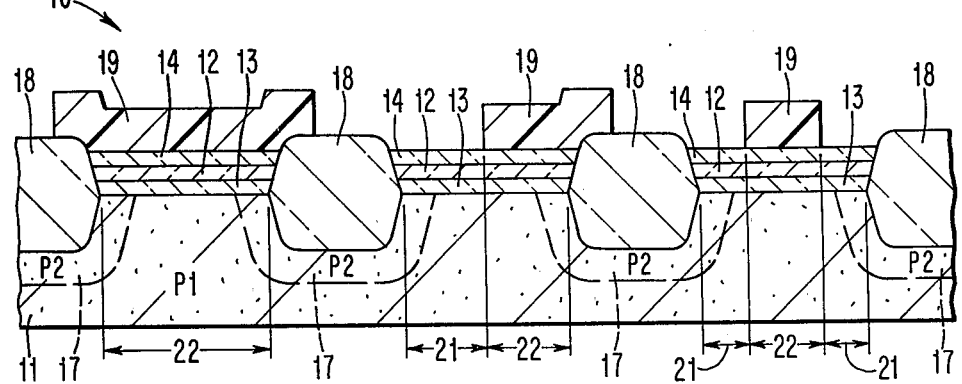

Referring now to FIG. 5C, there is shown a cross-sectional view of circuit 10 in a still later intermediate state after a delineated layer of photoresist 19 is utilized to mask a portion of the remaining portions of oxide barrier layer 12. FIG. 5C should be considered in conjunction with FIG. 5D. The latter is a perspective view of the leftmost region 15 of FIG. 5C and shows clearly that a portion of the remaining portions of layers 12, 14 are to be removed pursuant to the requirement mentioned above.

Figure 5D:
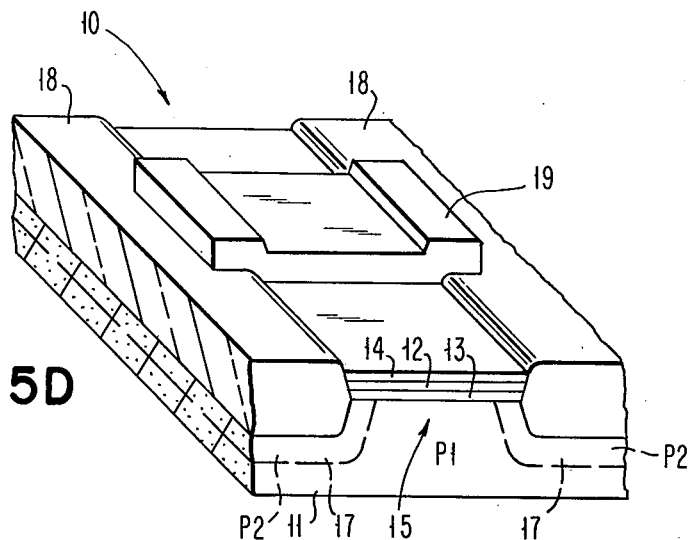
FIG. 5D is a perspective view of the left-most device region in the cross-sectional view of FIG. 5C.

In FIG. 5C a resist layer is formed, exposed and developed in the usual way using a mask, leaving resist portions 19 covering portions of thin oxide layer 14 and certain of recessed oxide regions 18. FIG. 5D shows a resist portion 19 covering a portion of layer 14. This is the aforementioned second basic lithographic masking operation.

The portions of underlying regions 15 not covered by resist portions 19 will become device regions 21, containing for example, a FET or a bipolar transistor. Regions 15 or portions thereof covered by resist portions 19 as shown in FIG. 5C will become self-aligned contact regions 22. In the description of FIGS. 5A-5F, the fabrication of the transistor device structure will not be addressed. However, in a later discussion of FIGS. 6 and 7, the fabrication of a polysilicon-gate FET structure with self-aligned vias to source and drain regions will be described. The FET device gate and gate contact fabrication requires a third and a fourth basic lithographic masking operation not shown in FIGS. 5A-5F. Returning to FIGS. 5C and 5D, patterns in the remaining portions of nitride layer 12 are formed only where the resist portions 19 overlap the remaining portions of nitride layer 12. Portions of the thus exposed thin oxide layer 14 are removed by etching in buffered hydrofluoric acid, and then resist portions 19 are removed by dissolving in an appropriate solvent. Then, portions of the remaining portions of oxidation barrier layer 12 are removed by etching in hot phosphoric acid, if layer 12 is of silicon nitride, leaving layer 13 intact. If desired, layer 12 can be used as a mask to define layer 13.

Figure 5E:
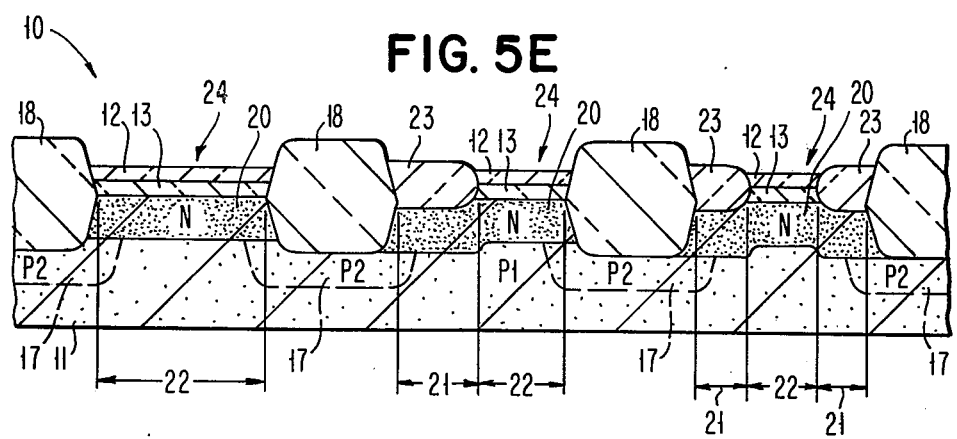

Now, two or more lithographic masking operations are employed in a known manner to fabricate a desired semiconductor device, such as a transistor. The result of such masking operations is shown in FIGS. 6C, 6D. Bipolar and field effect transistors will require n-type doped regions, such as shown in FIG. 5E which shows a plurality of n-type doped regions 20 disposed in silicon substrate 11. Regions 20 may be formed by ion implantation or by diffusion of an n-type species such as arsenic or phosphorus. Preferably, n-type doping is provided by ion implantation of arsenic ions with a dose of about $4 \times 10^{15} cm^{-2}$ and an energy of 150 KeV. About 98 percent of the arsenic ions penetrate through the thin 400 Å thick oxide layer 13 to form regions 21 wherein devices can be fabricated, and about 69 percent penetrate through the combined thickness of 400 Å thick oxide layer 13 and 700 Å thick nitride layer 12 to form n-type self-aligned contact regions 22 to which self-aligned contacts are to be applied.

After the ion implantation step, the next step in the process is to form a thick insulation oxide 23 over the entire structure except over the contact regions 22 which are still protected by portions of the oxidation barrier layer 12. Insulation oxide 23 may be formed by thermal oxidation in dry oxygen or steam, preferably steam at about 950° C. to a thickness of about 5000 Angstroms.

In the method of the present invention, it is required that insulation oxide 23 be formed by thermal oxidation. In contrast, if a chemical vapor deposited oxide were employed to form the insulation oxide as described, for example, by J. T. Clemens, et al. IEEE IEDM Tech. Digest, pp. 299-302, Dec. (1975), Washington, D.C., then the portions of oxidation barrier layer 12 in the contact regions 22 would be covered with oxide and their subsequent self-aligning contact function would be prevented.

The remaining portions of nitride layer 12 are now removed by dissolving in a hot phosphoric acid solution. Other elements of circuit 10 are protected by silicon dioxide and are thus not attacked by the dissolving solution.

The remaining portions of oxide layer 13 are now removed by dissolving in buffered hydrofluoric acid. Oxide is not consumed to any significant extent from insulation oxide 23 or from recessed isolation oxide regions 18 during this short time in the "dip etching" step. Contact regions 22 are now exposed and self-aligned contact vias 24 are formed in the surrounding recessed oxide isolation regions 18 and/or insulation oxide 23 as indicated in FIG. 5E. Additional n-type dopant can be provided in contact regions 22, if desired, by an unmasked or "blanket" implantation of an n-type dopant species such as phosphorus.

Next, a metallic-type highly-conductive interconnection line material, preferably a metal, is deposited and the interconnection pattern is delineated. An example of high-conductive material commonly used for interconnections is aluminum which may contain relatively small amounts of impurities introduced to decrease electromigration effects or to prevent or reduce chemical reactions between the aluminum and the semiconductive material to be contacted. The high-conductive material such as aluminum may be deposited by sputtering or, preferably, by evaporation to a thickness of 5000 to 10000 Å, preferably 7000 Å.

It should be noted that a diffusion barrier layer (not shown) may be placed between the aluminum and the silicon or polysilicon semiconductive material to prevent or reduce chemical reaction between the aluminum and the semiconductive material. The barrier layer may be of a metal such as titanium or chromium, or of an intermetallic silicide such as platinum silicide or palladium silicide.

Next, a photoresist layer is applied to the assembly. The resist material is exposed with UV radiation using a predetermined mask pattern and the unexposed regions of the resist are dissolved away. This is the fifth basic lithographic masking step. Then the structure is treated to remove the portions of the conductive material not protected by the resist. When a barrier layer is employed under the conductive material, the pattern in the conductive material can serve as an etching mask for delineating the barrier layer.

Figure 5F:
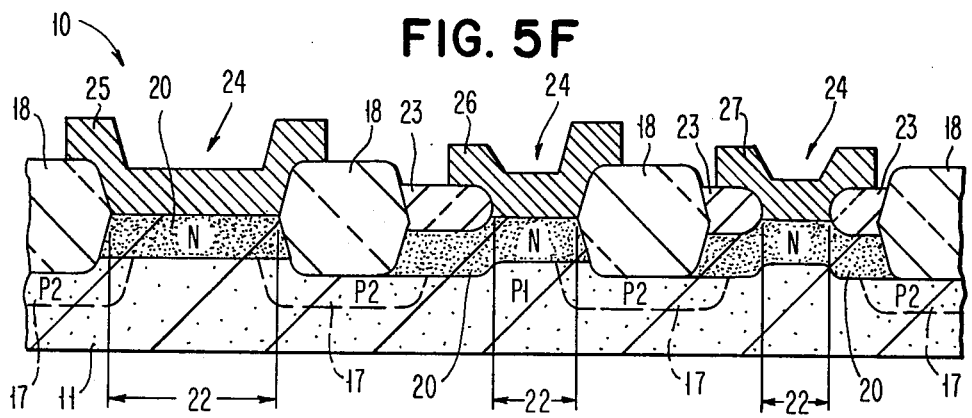

FIG. 5F is a cross-sectional view of substrate 11 showing three aluminum lines 25, 26, 27 disposed in self-aligned contact vias 24 and electrically connected to n-type doped regions 22. Line 25 is connected to leftmost contact region 22. The latter is self-aligned to recessed isolation oxide regions 18 on both sides thereof and, as a result, contact via 24 is also self-aligned to both oxide regions 18 and contact region 22. Line 26 is connected to the center contact region 22 which is surrounded on three sides by thick insulation oxide 23 and is self-aligned on the remaining side to a recessed oxide isolation region 18. Center contact via 24 is self-aligned to the same region 18 and to the right-hand edge of contact region 22. Finally, line 27 is connected to rightmost contact region 22 which is surrounded on all sides by thick insulation oxide 23. All three contacts 25-27 depicted in FIG. 5E are electrically functional and can be used in an integrated circuit as required.

In connection with the above-described process, it should be appreciated that ion implantation to form n-type doped regions 20 can take place prior to the second patterning of portions of oxidation barrier layer 12 instead of after the second patterning as done in the preferred method steps without departing from the spirit of the present invention. Under such circumstances, the depth of the ion implantation would be the same everywhere in substrate 11 and the fabrication of active transistor devices would be slightly more complicated.

In comparing the self-aligned contact vias 24 of FIG. 5F with those of the prior art illustrated in FIGS. 1-4, it is seen that the contact area of the present invention is self-aligned with respect to the isolation oxide regions 18, which advantageously leads to a smaller contact area. It should also be noted that the method also advantageously provides a metal-to-semiconductor contact of minimum size with contact area and resistance which is relatively independent of lithographic mask-to-mask misregistration. Also, the method contact area of the present invention advantageously does not use an etched contact hole or via which is more likely to cause spurious contacts if pinholes are present in the associated photo mask. Finally, the metal step coverage at the boundary of the contact is advantageously reduced.

In FIGS. 6A-6E, the preparation of a polysilicon-gate MOSFET employing the method of the present invention is shown. FIGS. 6A-6E illustrate cross-sectional views of the structure. FIGS. 7A-7E illustrate top views of the masking steps employed in the preparation of the polysilicon-gate MOSFET of FIGS. 6A-6E.

Figure 6A:
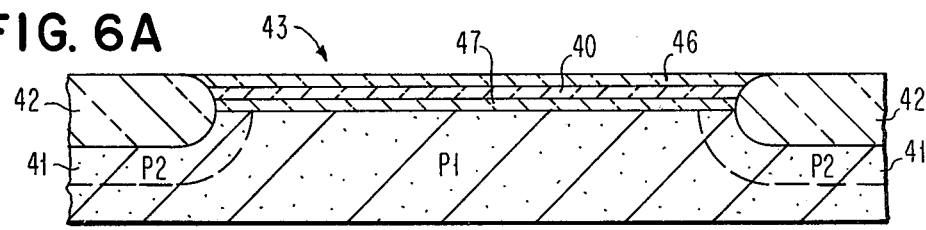
FIGS. 6A-6E show a cross-sectional view of a polysilicon-gate FET with self-registering contact vias to source and drain fabricated utilizing the method of the present invention.
Figure 7A:
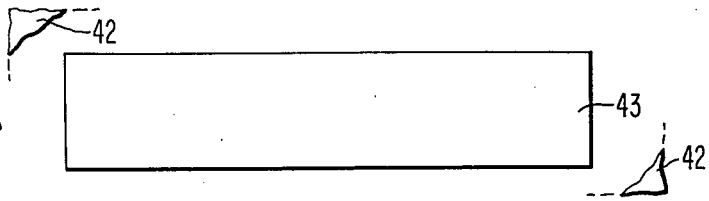
FIGS. 7A-7E show a top view of the masking patterns of the polysilicon-gate FET with self-registering contact vias to source and drain.

Referring to FIGS. 6A and 7A, nitride oxidation barrier consisting of silicon oxide layers 46 and 47 and layer 40 is masked and defined; boron channel stopper 41 is implanted, the defining resist pattern is dissolved and isolation oxide 42 is grown. Isolation oxide 42 must be formed by thermal oxidation, preferably in the presence of steam at about 950° C. to a thickness of about 6500 Angstroms. This completes the first masking operation; the formation of recessed isolation oxide 42, and delineation of the device region 43 wherein an FET is to be formed.

Figure 6B:
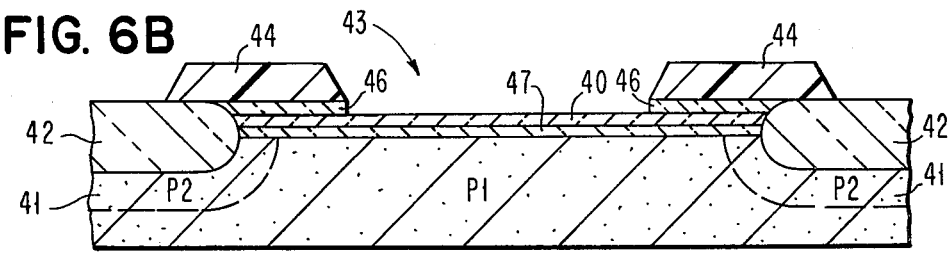
Figure 6C:
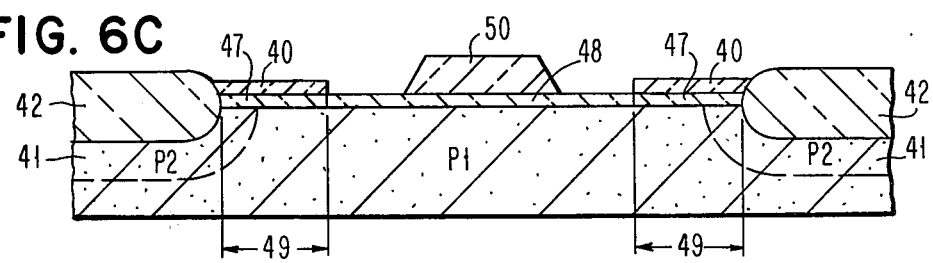
Figure 6D:
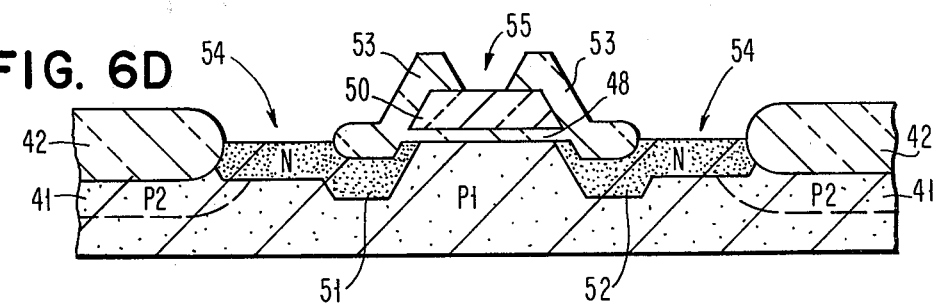
Figure 7B:
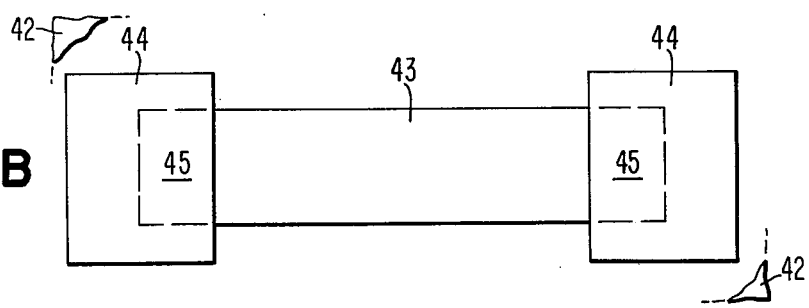

Next, referring to FIGS. 6B and 7B, a portion of nitride layer 40 is patterned. It is noted from the top view shown in FIG. 7B that the resist masking pattern 44 is placed over portions of device region 43, and extends over recessed isolation oxide 42 at both ends of device region 43 to provide the self-alignment feature. It is noted from FIG. 7B that resist pattern 44 consists of a rectangular region positioned orthogonal to and may partially or totally extend onto the recessed isolation oxide region 42. This completes the second masking operation. To form a contact of minimum area, a resist line of minimum linewidth must cross a doped line (to be provided in a subsequent step) of minimum linewidth, and extend onto the recessed field oxide 42 on either side of the doped region, yielding a rectangular contact area 45, as shown in FIG. 7B.

Figure 7C:
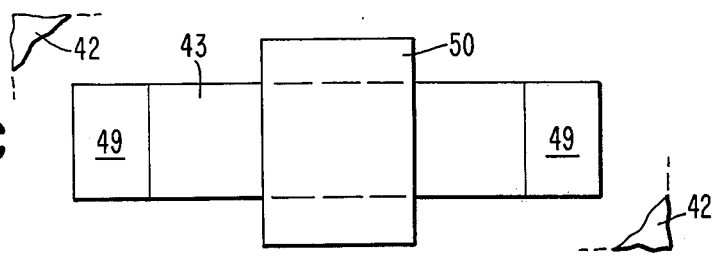
Figure 7D:
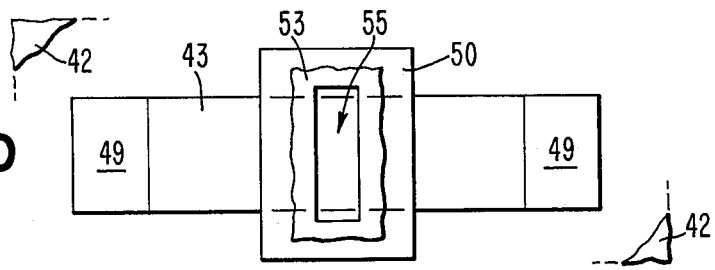

Thin oxide layer 46 is etched in buffered hydrofluoric acid; resist regions 44 are dissolved in a suitable solvent; nitride oxidation barrier 40 is etched in a hot phosphoric acid solution and oxide layers 46, 47 are dissolved in buffered hydrofluoric acid except where masked. Referring now to FIGS. 6C and 7C, a thin FET gate oxide 48 is fabricated, preferably by thermal oxidation at about 950° C. in the presence of oxygen, and preferably to a thickness of about 500 Angstroms. Gate oxide 48 will not be formed in the contact regions 49 protected by the remaining portions of the nitride layer 40. Next, a layer of polysilicon is deposited, preferably by chemical vapor deposition, and is doped n-type by known implantation or diffusion techniques. Then, a resist layer is applied to the structure and the polysilicon pattern 50 shown in FIGS. 6C and 7C is obtained. A thin oxide layer may be provided over the polysilicon layer to aid in its delineation. This completes the third masking operation.

The n-type source and drain regions 51 and 52, respectively, of an FET are now formed as shown in FIG. 6D by diffusion or ion implantation as previously described. Preferably, ion implantation of arsenic ions of about 150 KeV energy and about $4 \times 10^{15} cm^{-2}$ dose is employed. Then, insulation oxide 53 is formed over the n-type source and drain regions 51, 52, respectively, and over n-type polysilicon regions 50. Thick insulation oxide layer 53 must be formed by thermal oxidation, preferably in the presence of steam at about 950° C. to a thickness of about 5000 Angstroms. At this point, it should be appreciated, that thick oxide insulation layer 53 grows up to the boundary of the remaining portion of oxidation barrier layer 40 in such a way that the remaining portions of layer 40 are surrounded by either insulation oxide or isolation oxide forming self-aligned contact vias 54. The portions of the nitride layer 40 remaining over the doped silicon substrate regions are then removed by dissolving in hot phosphoric acid. No masking of the structure is required at this stage in the process as the nitride dissolving solvent does not attack the other portions of the structure which are covered with silicon dioxide. Then, a resist pattern is provided using the masking pattern shown in FIG. 7D. A contact via 55 to the polysilicon regions 50 is formed by chemical or plasma etching in a known manner. If desired, additional n-type dopant may be provided in the contact areas by a blanket implantation of phosphorus ions. The entire structure is now subjected to a dip etching step which removes remaining portions of thin oxide layer 47 in contact areas 49. This step does not affect the thicknesses of isolation and insulation oxides 42, 53, respectively, to any serious degree. A cross-sectional view of the structure at this stage of the process is shown in FIG. 6D.

Figure 6E:
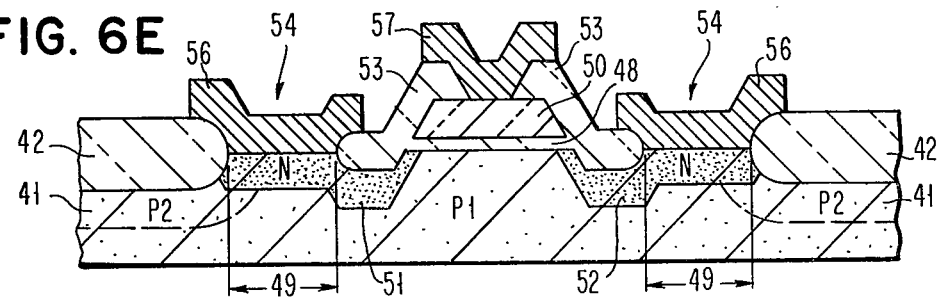
Figure 7E:
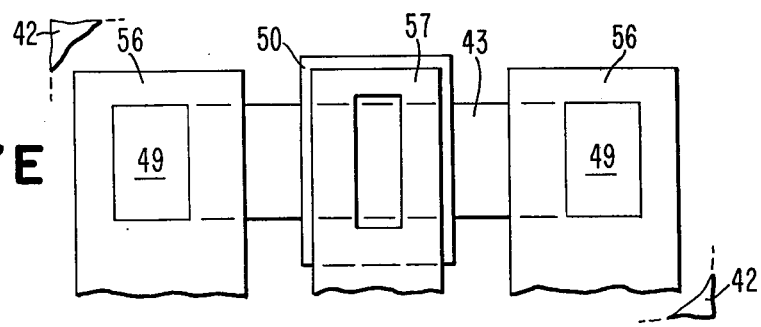

An aluminum layer is deposited on the structure and is patterned using the fifth masking pattern shown in FIG. 7E resulting in contacts 56 to contact areas 49 and contact 57 to polysilicon gate 50. Intervening metallic layers may be provided to prevent metallic penetration and improve contact reliability as described previously. A cross-sectional view of the FET at the end of the process is shown in FIG. 6E. Finally, well-known passivation, dicing, and bonding operations (not shown) are performed to complete the integrated circuit fabrication. The MOSFET process described above requires five basic masking operations for recessed oxide isolation regions, self-aligned contact vias, polysilicon gate, etched via to polysilicon regions, and aluminum interconnection patterns.

Figure 8A:
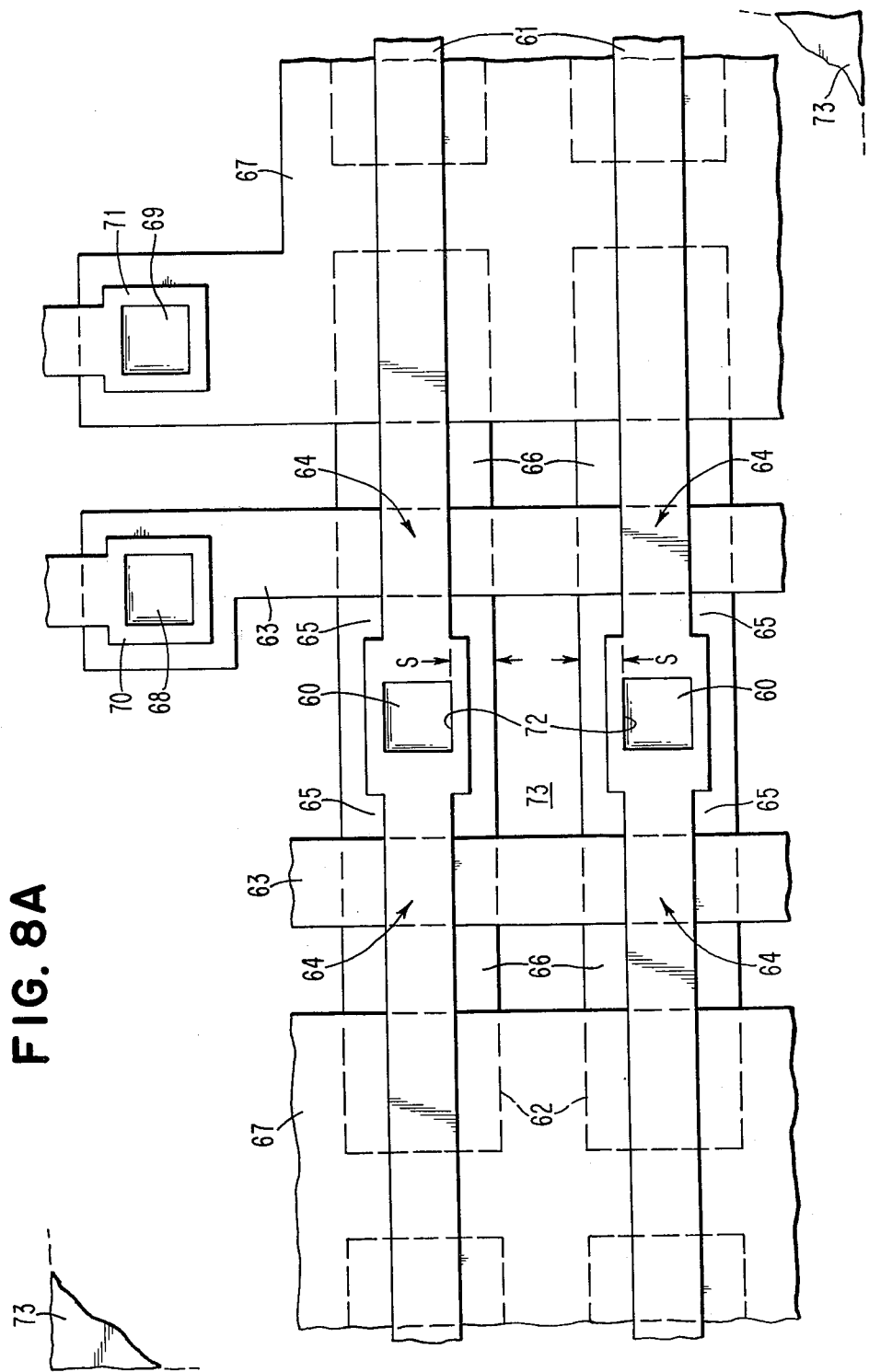
FIGS. 8A, 8B compare top views of one-device dynamic RAM cells that show, in FIG. 8A, the conventional etched contact via technique of the prior art and, FIG. 8B, the self-registering contact method of the present invention.
Figure 8B:
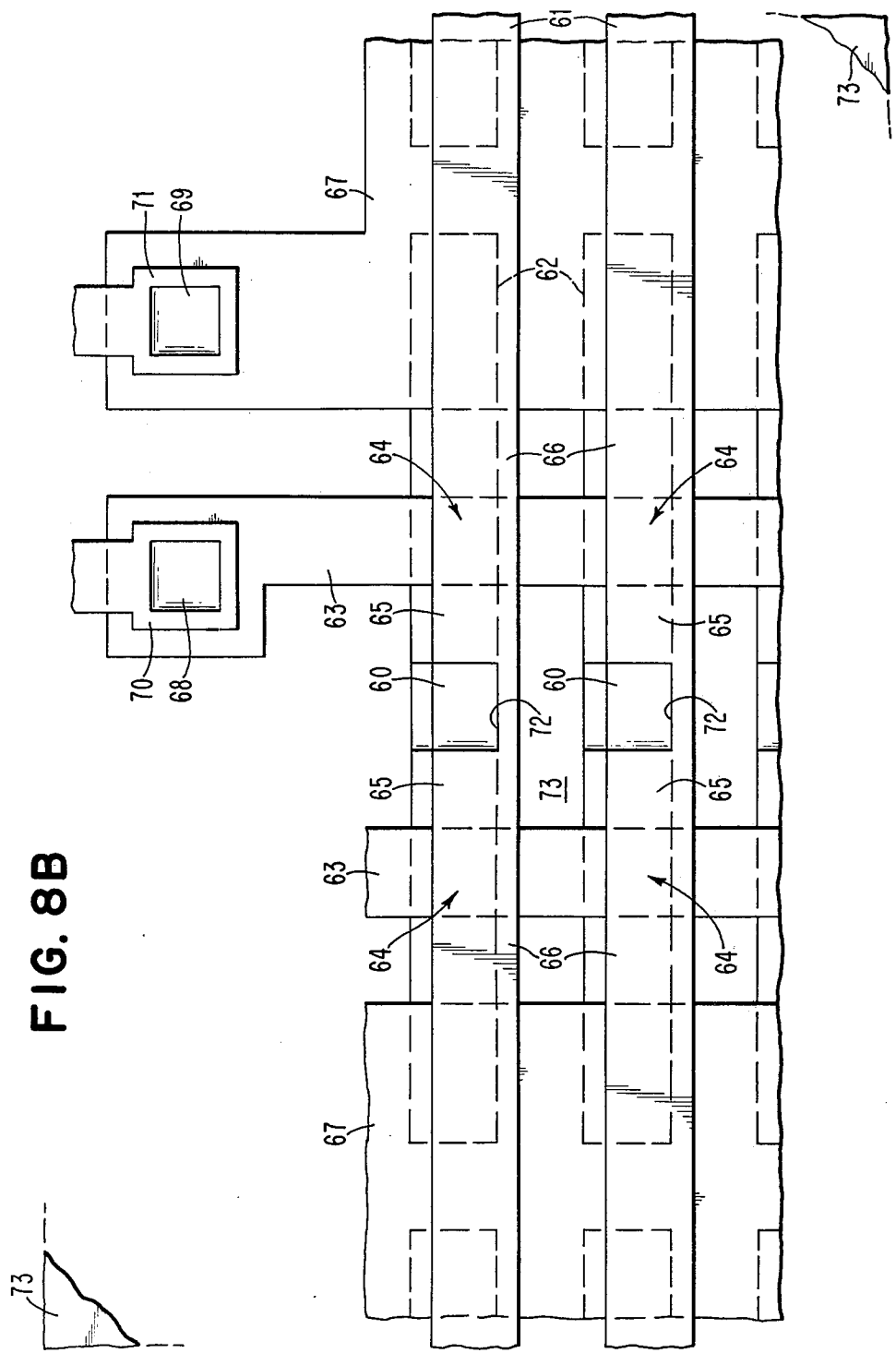

Referring now to FIGS. 8A, 8B, plan views are shown of dynamic random-access-memory (RAM) one-device cells made using, in FIG. 8A, metal-to-n-type doped region contacts with an etched via of the prior art and, in 8B, a self-aligned contact via of the method of the present invention. The cell shown in FIG. 8A has been used in commercial 4096 bit and 16384 bit dynamic RAM chips.

A one-device cell consists of an FET switch and a charge storage capacitor. Information (i.e., electronic charge) stored in the capacitor is accessed by means of two orthogonal address lines; a polysilicon word line and a metal bit line. The metal bit line contacts the diffused n-type FET source regions of the FETs of two adjacent cells. In FIG. 8A, etched vias 60 connect metal bit lines 61 to underlying n-doped regions 62. Polysilicon gates 63 which are word lines for the memory cells of FIG. 8A are disposed under metallization 61; over a channel region 64 and between source and drain regions, 65, 66, respectively. Polysilicon capacitor plates 67 disposed adjacent drains 66 and over the underlying semiconductor substrate complete the memory cell structures. Gate contact 68 and plate contact 69 adjacent to the array of cells provide electrical connection between metallizations 70, 71, respectively, and polysilicon gate 63 and polysilicon plate 67, respectively.

For any given lithographic linewidth capability, it is desirable to make the RAM cell area as small as possible so as to increase the number of chips fabricated per wafer. As is shown in FIG. 8A, the area of the memory cell is increased by the required misalignment borders on the metal-to-diffusion contact near etched vias 60. The area of the contact is, in turn, influenced by the misalignment spacing S required between the edge of contact via 60 and edge 72 of the recessed isolation oxide 73.

Referring now to FIG. 8B, the cells shown therein utilize self-aligned contact vias of the present invention and are smaller than those shown in FIG. 8A by about 25 percent for the same ratio of storage capacitance to bit line capacitance because of the elimination of misalignment borders. The cells of FIG. 8B utilize a metal-to-n-type silicon contact of minimum area formed by the crossing of a resist line of minimum line width with a doped region of minimum width. The resist line extends onto the recessed isolation oxide on either side of the doped region yielding the rectangular contact area shown in FIG. 8B.

The same elements in FIG. 8B have been given the same reference numbers as those shown in FIG. 8A. Thus, contact vias 60 are self-aligned at their top and bottom portions to the edges of recessed isolation oxide 73. Bit line metallization 61 can be slightly misregistered with respect to contact vias 60 without affecting the areal considerations involved. Indeed, no misalignment spacing S (see FIG. 8A) between edges 72 of recessed isolation oxide 73 need be provided in the cells because the top and bottom edges of contact vias 60 are self-aligned to recessed isolation oxide 73 as indicated in FIG. 8B. Thus, the spacing between memory cells in FIG. 8B can be minimized because no misregistration regions need be provided to insure that contact vias 60 are over underlying doped regions 62. It should be clear in comparing FIGS. 8A and 8B, that providing self-aligned contact vias, as in the instance of FIG. 8B, provides reduced areal requirements and, as a result, a higher density of memory cells per chip.

Figure 9A:
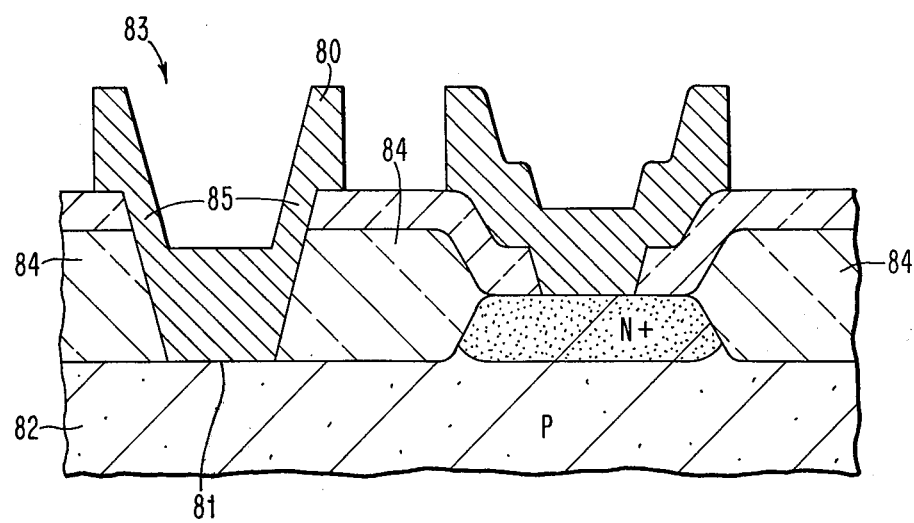
FIGS. 9A, 9B compare cross-sectional views of contacts between an aluminum line and p-type substrate and n-type doped regions fabricated showing, in FIG. 9A, etched contact vias of the prior art and, in FIG. 9B, the self-registering contact method of the present invention.

In fabricating integrated circuits, for example n-channel FET integrated circuits, it is often necessary to provide an ohmic contact to the substrate (e.g., the p-type substrate). This contact is used to provide a constant negative bias to the p-type substrate. With certain chip bonding techniques such as the so-called flip chip, solder-ball bonded technique, the substrate contact must be provided on the same substrate surface as the devices. One can provide this contact by etching entirely through the recessed isolation oxide, but the vertical device structure and the thickness of the isolation oxide (about 6500 Å) relative to that of the metal interconnection material (about 10,000 Å) may lead to thinning of the metal as shown in FIG. 9A. FIG. 9A shows a cross-sectional drawing of a portion of an integrated circuit wherein contacts are made to both a p-type substrate and to an n-type doped region in the substrate. In FIG. 9A, contact 80 is made to area 81 of a p-type semiconductor substrate 82 through an etched via 83 in recessed oxide isolation region 84. As indicated above, thinning of the metal of contact 80 occurs at region 85 at the boundary of the contact via 83 and isolation region 84. Thinning at region 85 causes high current densities leading to possible burn-out of the metallization.

Figure 9B:
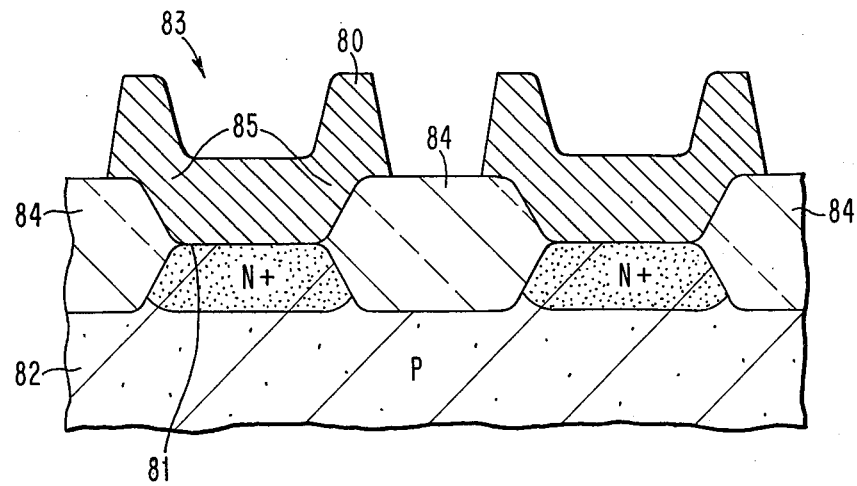

The method of the present invention may be applied to provide the p-type substrate contact 80 as shown in FIG. 9B, wherein the coverage step is about half of the thickness of recessed oxide 84 or only about 3250 Angstroms. The reference numbers used in FIG. 9A identify similar elements in FIG. 9B. In fabricating self-aligned metal-to-p-type and n-type regions on the same chip, the nitride regions for both contact areas are fabricated using a second masking operation. Then, a separate resist masking operation is used to provide a blockout mask over p-type contact area 81 to prevent the implanted n-type arsenic ions from entering the p-type contact area 81. In comparing FIGS. 9A and 9B, the metal step coverage of contacts to both n-type and p-type regions is advantageously improved with the method of the present invention over etched contact vias of the prior art. Indeed, the thickness of the metallization in region 85 of FIG. 9B is considerably greater than the metallization thickness in region 85 of FIG. 9A.

Having thus described our invention, what we claim as new, and desire to secure by Letters Patent is:

1. In a process for fabricating semiconductor integrated circuits on a semiconductor substrate containing at least an oxidation barrier covered region on the surface thereof, said oxidation barrier covered region being formed by patterning and etching an oxidation barrier layer, which steps expose the remainder of said substrate surface, said remainder of said substrate surface being covered with a thermally grown recessed oxide region the latter being formed by thermally oxidizing said remainder of said substrate surface, the steps of:
   masking a portion of said oxidation barrier,
   applying an etchant to the unmasked oxidation barrier to etch it away and expose a portion of said substrate surface,
   reoxidizing said exposed portion of said substrate surface to form insulation oxide therein,
   removing said portion of said oxidation barrier to expose another portion of said substrate surface and form a via which is self-aligned to only a portion of said thermally grown recessed oxide region.

2. In a process for fabricating semiconductor integrated circuits according to claim 1 further including the step of:
   introducing conductive material into said self-aligned via to contact the thus exposed another portion of said substrate surface.

3. In a process for fabricating semiconductor integrated circuits according to claim 2 wherein the step of introducing conductive material into said self-aligned via to contact the thus-exposed another portion of said substrate surface includes the steps of depositing conductive material in at least said self-aligned via to contact the thus-exposed another portion of said substrate surface and delineating it.

4. In a process for fabricating semiconductor integrated circuits according to claim 2 wherein said conductive material is aluminum.

5. In a process for fabricating semiconductor integrated circuits according to claim 1 further including the step of:
   forming a transistor device after the step of applying an etchant in the exposed said a portion of said substrate surface while retaining said portion of said oxidation barrier in a state unaffected by said transistor device forming step.

6. In a process for fabricating semiconductor integrated circuits according to claim 1 wherein said semiconductor substrate is silicon.

7. In a process for fabricating semiconductor integrated circuits according to claim 1 wherein said oxidation barrier is made of a material selected from the group consisting of silicon nitride, aluminum nitride, boron nitride, aluminum oxide and silicon carbide.

8. In a process for fabricating semiconductor integrated circuits according to claim 1 wherein said oxidation barrier is silicon nitride.

9. In a process for fabricating semiconductor integrated circuits according to claim 1 wherein said reoxidizing step includes the step of thermally regrowing an oxide of the semiconductor of said semiconductor substrate on said exposed portion of said substrate surface.

10. In a process for fabricating semiconductor integrated circuits according to claim 1 wherein the step of removing said portion of said oxidation barrier includes the step of etching said portion of said oxidation barrier to form a self-aligned via over said another portion of said substrate surface.

11. In a process for fabricating semiconductor integrated circuits according to claim 1 further including the step of providing oxide layers above and below said oxidation barrier.

12. In a process for fabricating semiconductor integrated circuits according to claim 1 further including the step of:
   forming a memory cell after the step of applying an etchant in the thus-exposed said portion of said substrate surface while retaining said portion of said oxidation barrier in a sate unaffected by said memory cell forming step.

13. In a process for fabricating semiconductor integrated circuits according to claim 1 further including the step of:
   forming at least a doped region in said semiconductor substrate the boundary of which is self-aligned to the edges of said thermally grown recessed oxide region and extends beneath said oxidation barrier.

14. In a process for fabricating semiconductor integrated circuits according to claim 13 wherein the step of forming at least a doped region is carried out after the step of applying an etchant.

15. In a process for fabricating semiconductor integrated circuits according to claim 13 wherein the step of forming at least a doped region is carried out prior to the step of masking a portion of said oxidation barrier.

16. In a process for fabricating semiconductor integrated circuits according to claim 1 wherein said self-aligned via has at least a portion elsewhere than where it is self-aligned to only a portion of said thermally grown recessed oxide regions which is bounded by said insulation oxide.

* * * * *